(12) United States Patent
Kuriki et al.

(10) Patent No.: US 9,799,635 B2
(45) Date of Patent: Oct. 24, 2017

(54) LIGHT-EMITTING APPARATUS

(71) Applicants: CITIZEN ELECTRONICS CO., LTD., Fujiyoshida-shi, Yamanashi (JP); CITIZEN WATCH CO., LTD., Nishitokyo-shi (JP)

(72) Inventors: Shingo Kuriki, Fujiyoshida (JP); Takakazu Yano, Tokyo (JP); Takeshi Yoshida, Toyonaka (JP); Toshihisa Shirai, Yamanashi (JP); Satoshi Abe, Hachioji (JP)

(73) Assignees: CITIZENS WATCH CO., LTD., Tokyo (JP); CITIZEN ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 15/158,875

(22) Filed: May 19, 2016

(65) Prior Publication Data
US 2016/0343693 A1  Nov. 24, 2016

(30) Foreign Application Priority Data

May 20, 2015 (JP) .................................. 2015-103130

(51) Int. Cl.
| | | |
|---|---|---|
| *H01L 25/075* | (2006.01) | |
| *H01L 33/48* | (2010.01) | |
| *H01L 33/62* | (2010.01) | |
| *H01L 25/16* | (2006.01) | |

(52) U.S. Cl.
CPC ........ *H01L 25/0753* (2013.01); *H01L 25/167* (2013.01); *H01L 33/486* (2013.01); *H01L 33/62* (2013.01)

(58) Field of Classification Search
CPC . H01L 25/0753; H01L 25/167; H01L 33/486; H01L 33/62
See application file for complete search history.

(56) References Cited

U.S. PATENT DOCUMENTS

| | | | |
|---|---|---|---|
| 2006/0001361 A1 | 1/2006 | Imai et al. | |
| 2015/0276198 A1* | 10/2015 | Hata | ..................... H01L 33/644 362/382 |

FOREIGN PATENT DOCUMENTS

| | | |
|---|---|---|
| JP | 2006-005290 A | 1/2006 |
| JP | 2015-201614 A | 11/2015 |

* cited by examiner

*Primary Examiner* — Thomas M Sember
(74) *Attorney, Agent, or Firm* — RatnerPrestia

(57) ABSTRACT

Provided is a light-emitting apparatus including a substrate, first and second pairs of terminals, each pair including two terminals disposed at two opposed positions on the substrate, a first plurality of light-emitting devices which are mounted in one of two sections formed by bisecting a mounting region on the substrate by a line segment jointing the two positions, and which are connected to the first pair of terminals, and a second plurality of light-emitting devices which are mounted in the other section of the mounting region, and which are connected to the second pair of terminals, and wherein the first and second plurality of light-emitting devices are arranged in a direction parallel to the line segment, and are each mounted at an angle relative to one side of the substrate.

6 Claims, 10 Drawing Sheets

LIGHT-EMITTING APPARATUS

CROSS REFERENCE TO RELATED APPLICATION

This application is a new U.S. patent application that claims benefit of JP 2015-103130, filed on May 20, 2015. The entire contents of JP 2015-103130 are hereby incorporated by reference.

TECHNICAL FIELD

The present invention relates to a light-emitting apparatus.

BACKGROUND ART

It is known to provide a light-emitting apparatus constructed using COB (Chip On Board) technology by mounting light-emitting devices such as LED (light-emitting diode) devices directly on a conventional substrate such as a ceramic or metal substrate. In such light-emitting apparatuses, the LED devices which emit, for example, blue light are sealed with a phosphor-containing resin, and the light emitted from the LED devices is combined with the light generated by exciting the phosphor with the emitted light, thereby producing light of a desired color such as white light according to the purpose.

For example, Japanese Unexamined Patent Publication No. 2006-005290 discloses a light-emitting diode including a high thermal conductivity heat sink base having a die bonding mounting surface, a circuit substrate placed on the heat sink base and having an opening in which a portion of the mounting surface is exposed and a projecting portion projecting outwardly of an outer periphery of the heat sink base, a light-emitting device mounted on the mounting surface through the opening, and an optically transmissive resin member covering the top of the light-emitting device, wherein a through-hole electrically conductive to the light-emitting device is formed in an outer periphery of the projecting portion, and externally connecting electrodes are provided on the upper and lower faces of the through-hole.

SUMMARY

Some light-emitting apparatuses, in particular, those used for accent lighting, projection lighting, etc., are required to produce intense light. One way to increase the light intensity is to increase the output by increasing the number of light-emitting devices mounted in the apparatus, but if the output wattage is simply increased, a power supply available off the shelf may be unusable as the power supply for the light-emitting apparatus. Furthermore, since many applications require the use of a compact apparatus, the output must be increased without increasing the apparatus size. However, if the apparatus size is restricted, restrictions are also imposed on other design considerations such as the placement and arrangement of the power terminals within the apparatus, the geometries of the interconnect patterns formed on the substrate, and the placement and arrangement of the patterns; accordingly, unless some ingenious design is devised, it is not possible to increase the number of light-emitting devices that can be mounted in the apparatus.

It is accordingly an object of the present invention to provide a light-emitting apparatus that can operate with an "off the shelf" power supply and that permits an increase in the number of light-emitting devices without increasing the apparatus size.

Provided is a light-emitting apparatus including a substrate, first and second pairs of terminals, each pair including two terminals disposed at two opposed positions on the substrate, a first plurality of light-emitting devices which are mounted in one of two sections formed by bisecting a mounting region on the substrate by a line segment jointing the two positions, and which are connected to the first pair of terminals, and a second plurality of light-emitting devices which are mounted in the other section of the mounting region, and which are connected to the second pair of terminals, and wherein the first and second plurality of light-emitting devices are arranged in a direction parallel to the line segment, and are each mounted at an angle relative to one side of the substrate.

Preferably, in the above light-emitting apparatus, the two positions are two opposite corners of the substrate, the line segment is a diagonal line joining the two corners, the first plurality of light-emitting devices and the second plurality of light-emitting devices are respectively divided into a plurality of subgroups connected in parallel to one another, the plurality of subgroups each contain an equal number of light-emitting devices connected in series, and the first and second plurality of light-emitting devices together form a plurality of rows arranged with uniform spacing along the diagonal line.

Preferably, in the above light-emitting apparatus, the light-emitting devices contained in each of the plurality of subgroups are connected in series by wires, and any two adjacent ones of the light-emitting devices are oriented in the same direction or at an angle of 90, 180, or 270 degrees relative to each other so that the length of the wire connecting between the two light-emitting devices does not exceed a predetermined upper limit value.

Preferably, in the above light-emitting apparatus, the arrangement of the first and second plurality of light-emitting devices is symmetrical about the diagonal line or about a center point of the mounting region in terms of mounting position and rotation angle.

Preferably, in the above light-emitting apparatus, the first pair of terminals is connected to a first driver, the second pair of terminals is connected to a second driver which is different from the first driver, and the total number of the first and second plurality of light-emitting devices is larger than the number of light-emitting devices that can be driven by the first driver or the second driver.

The above light-emitting apparatus can operate with an "off the shelf" power supply and permits an increase in the number of light-emitting devices without increasing the apparatus size.

BRIEF DESCRIPTION OF THE DRAWINGS

Other features and advantages of the present invention will be apparent from the ensuing description, taken in conjunction with the accompanying drawings, in which.

DESCRIPTION

Hereinafter, with reference to the drawings, a light-emitting apparatus will be described. It should be noted that the technical scope of the present invention is not limited to embodiments of the invention, but covers the invention described in the claims and its equivalent.

Figure 1:
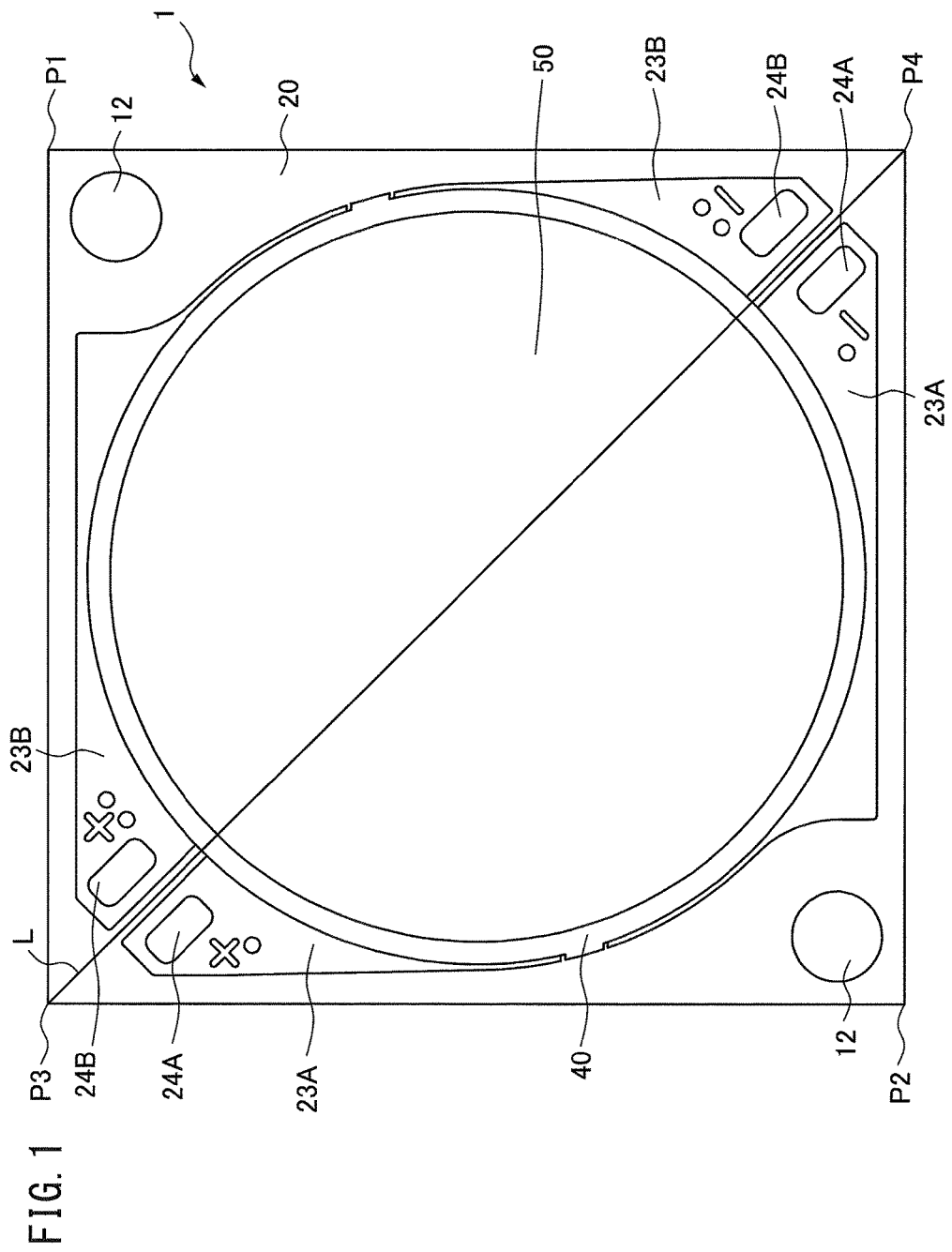
FIG. 1 is a top plan view of a light-emitting apparatus 1.
Figure 2:
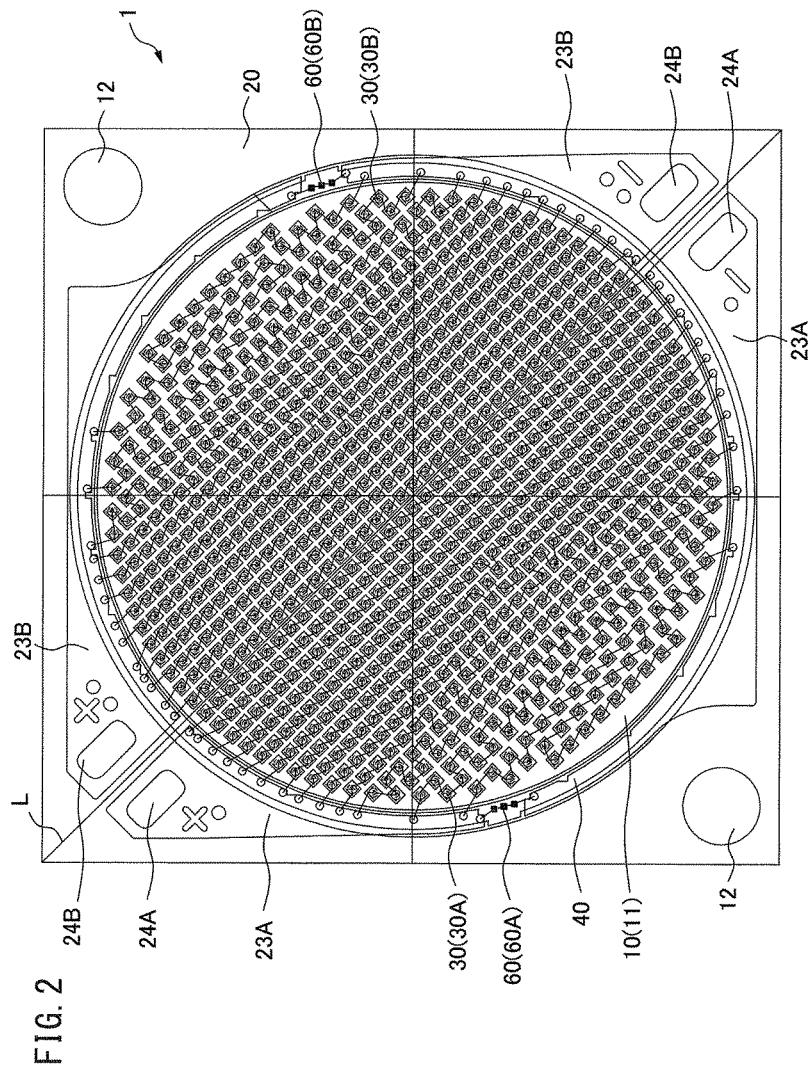
FIG. 2 is a top plan view showing the overall arrangement of LED devices 30 in the light-emitting apparatus 1.

FIG. 1 is a top plan view of a light-emitting apparatus 1. FIG. 2 is a top plan view showing the overall arrangement of LED devices 30 in the light-emitting apparatus 1. The light-emitting apparatus 1 incorporates the plurality of LED devices 30 as light-emitting devices, and is applicable for use as a light source for various kinds of lighting equipment such as illumination lighting, street lighting, and accent lighting. The light-emitting apparatus 1 includes, as major component elements, a mounting substrate 10, a circuit substrate 20, the LED devices 30, a sealing frame 40, a sealing resin 50, and Zener diodes 60. In FIG. 2, the sealing resin 50 is omitted from illustration, and the sealing frame 40 is shown as being transparent.

Figure 3:
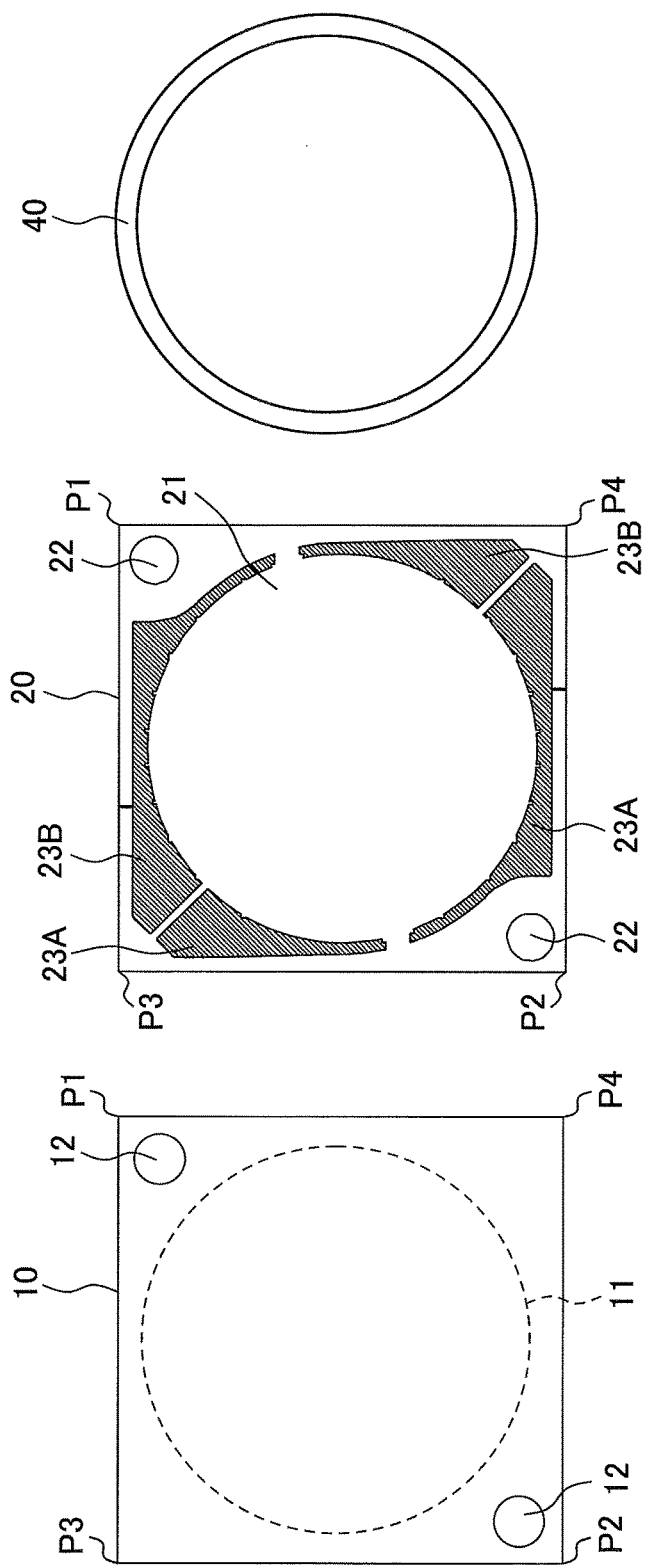
FIGS. 3A to 3C are top plan views of the mounting substrate 10, the circuit substrate 20, and the sealing frame 40, respectively.
Figure 4:
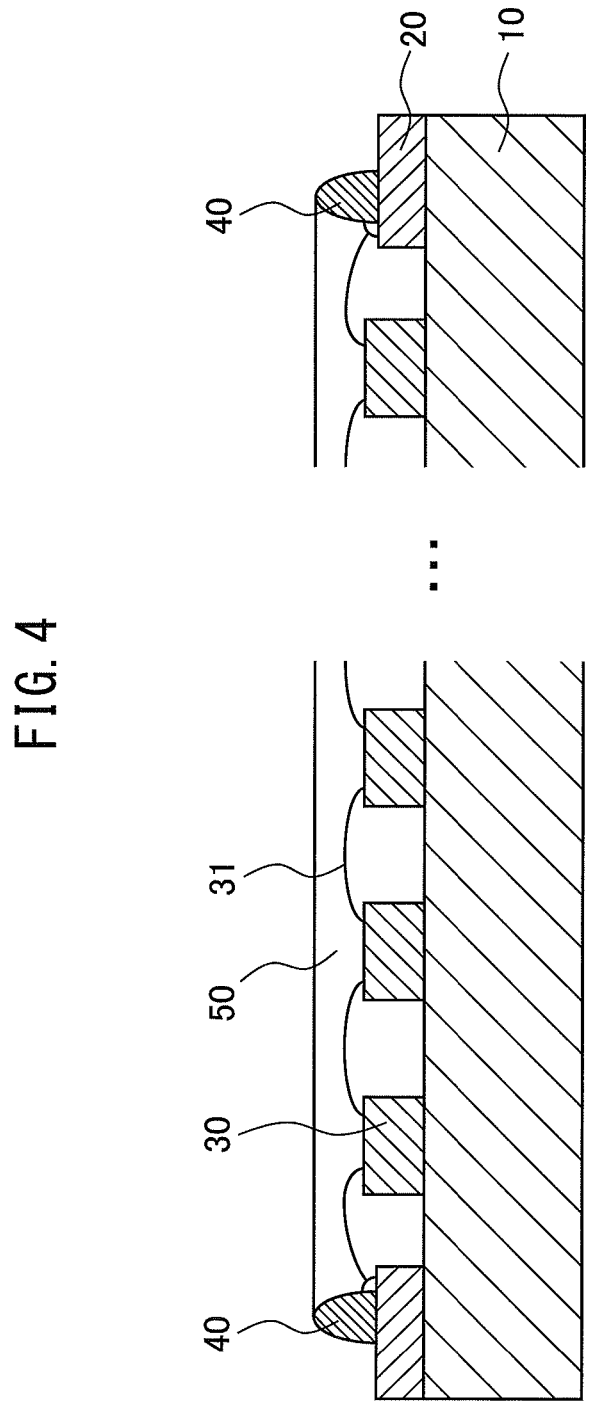
FIG. 4 is a schematic transverse cross-sectional view of the light-emitting apparatus 1.

FIGS. 3A to 3C are top plan views of the mounting substrate 10, the circuit substrate 20, and the sealing frame 40, respectively. FIG. 4 is a schematic transverse cross-sectional view of the light-emitting apparatus 1. Since the number of LED devices 30 mounted in the light-emitting apparatus 1 is large, some of them are omitted from illustration in FIG. 4 for convenience.

As shown in FIG. 3A, as an example, the mounting substrate 10 is a metal substrate of a rectangular shape, and a mounting region 11 on which the LED devices 30 are mounted is defined in the center of its upper surface. For example, the mounting substrate 10 is square in shape each of whose sides is 38 mm, and the mounting region 11 is circular in shape whose diameter is 32 mm. Fixing through-holes 12 for fixing the light-emitting apparatus 1 to a lighting fixture or the like by screws are formed near two corners P1 and P2 diagonally opposed on the mounting substrate 10.

The mounting substrate 10, which also functions as a heat sinking substrate for dissipating the heat generated from the LED devices 30 and phosphor particles, which will be described later, is formed, for example, from aluminum having good heat resistance and good heat sinking property. Some other suitable metal, such as copper, may be used as the material for the mounting substrate 10, as long as the material has good heat resistance and good heat sinking property. A substrate formed from a material other than a metal, for example, a ceramic substrate, may be used as the mounting substrate 10, but it is preferable to use a metal substrate, such as aluminum, from the standpoint of providing good heat sinking property.

As shown in FIG. 3B, as an example, the circuit substrate 20 has a rectangular shape of the same size as the mounting substrate 10, and includes a circular opening 21 in the center thereof. In the circuit substrate 20 also, fixing through-holes 22 are formed near the two diagonally opposite corners P1 and P2. The circuit substrate 20 is fixed in position with its lower surface bonded to the upper surface of the mounting substrate 10, for example, by means of an adhesive sheet, by aligning the fixing through-holes 22 with the fixing through-holes 12 formed in the mounting substrate 10. The mounting substrate 10 and the circuit substrate 20 thus bonded together constitute the substrate of the light-emitting apparatus 1. The upper surface of the mounting substrate 10 exposed through the opening 21 is the mounting region 11. Depending on the application of the light-emitting apparatus 1, the opening 21 and the mounting region 11 may be formed in other shapes such as an elliptical shape or a rectangular shape.

Two pairs of interconnect patterns 23A and 23B are formed on the circuit substrate 20 in such a manner as to encircle the opening 21. In FIG. 3B, the interconnect patterns 23A and 23B are represented by dark patterns to indicate their shapes. The interconnect patterns 23A and 23B are disposed opposite each other at either side of the diagonal line L joining the other two corners P3 and P4 of the circuit substrate 20 where the fixing through-holes 22 are not formed. The interconnect patterns 23A and 23B each include two patterns, one on the positive electrode side and the other on the negative electrode side (the anode side and the cathode side).

Further, as shown in FIGS. 1 and 2, two pairs of connecting electrodes 24A and 24B for connecting the light-emitting apparatus 1 to external power supplies are formed near the two opposite corners P3 and P4 of the circuit substrate 20 where the fixing through-holes 22 are not formed. Like the interconnect patterns 23A and 23B, the connecting electrodes 24A and 24B are disposed opposite each other at either side of the diagonal line L. Though the connecting electrodes 24A and 24B are not shown in FIG. 3B, the connecting electrodes 24A and 24B are formed on the respective interconnect patterns 23A and 23B. The connecting electrodes 24A and 24B are examples of the first and second pairs of terminals, and each pair includes a terminal on the positive electrode side and a terminal on the negative electrode side. When the two terminals of the connecting electrode 24A and the two terminals of the connecting electrode 24B are respectively connected to separate power supplies, and a voltage is applied therebetween, the light-emitting apparatus 1 emits light.

The LED devices 30 are each an example of a light-emitting device, which is, for example, a blue LED that emits blue light in a wavelength range of about 450 to 460 nm. The bottom face of the LED device 30 is bonded to the mounting region 11 defined on the upper surface of the mounting substrate 10 by such means as an electrically insulating transparent adhesive or the like. Further, the LED device 30 has a pair of device electrodes on its upper face, and the device electrodes on one LED device 30 are each electrically connected by a wire 31 to a corresponding one of the device electrodes on its adjacent LED device 30, as shown in FIG. 4. The wire 31 taken from the LED device 30 located at an edge of the mounting region 11 is connected to either one of the interconnect pattern 23A or 23B on the circuit substrate 20. In this way, a drive current is supplied to each LED device 30 via the wire 31.

In the light-emitting apparatus 1, the plurality of LED devices 30 mounted on the mounting region 11 are divided into two groups. The LED devices 30 mounted in one of two sections formed by bisecting the mounting region 11 on the mounting substrate 10 by the diagonal line L are one example of a first plurality of light-emitting devices, and are electrically connected to the positive and negative terminals of the connecting electrode 24A via the interconnect pattern 23A. On the other hand, the LED devices 30 mounted in the other section of the mounting region 11 are one example of a second plurality of light-emitting devices, and are electrically connected to the positive and negative terminals of the connecting electrode 24B via the interconnect pattern 23B. The LED devices 30 connected to the respective connecting electrodes 24A and 24B may hereinafter be referred to as the LED devices 30A and the LED devices 30B, respectively. That is, in the circular mounting region 11, the LED devices 30A and 30B are each mounted in one of the two semicircular sections formed by dividing the circular region along the diameter thereof.

The sealing frame 40 is, as shown in FIG. 3C, a circular frame member formed, for example, from a white resin to conform to the size and shape of the opening 21 of the circuit substrate 20, and is fixed to the outer circumferential portion of the opening 21 on the upper surface of the circuit substrate 20. The sealing frame 40 is a dam member for preventing the sealing resin 50 from flowing out, and also functions as a member by which the light emitted laterally from the LED devices 30 is reflected toward the upper side of the light-emitting apparatus 1 (the side opposite from the mounting substrate 10 as seen from the LED devices 30).

The sealing resin 50 is filled into the interior space of the opening 21, and covers and protects (seals) the plurality of LED devices 30 together with the wires 31. In the example shown in FIG. 1, the sealing resin 50 is molded in the shape of a disk, and is held fixedly onto the mounting substrate 10 by the sealing frame 40. It is preferable to use a colorless and transparent resin, such as an epoxy resin or a silicone resin, in particular, a resin having a heat resistance up to about 250° C., as the sealing resin 50.

A phosphor such as a yellow phosphor (not shown) is dispersed in the form of particles in the sealing resin 50. The yellow phosphor is, for example, a particulate phosphor material, such as YAG (yttrium aluminum garnet), that absorbs the blue light emitted from the LED devices 30 and wavelength-converts it into yellow light. The light-emitting apparatus 1 produces white light by combining the blue light emitted from the blue LED devices 30 with the yellow light generated by exciting the yellow phosphor with the emitted light.

The sealing resin 50 may alternatively contain a plurality of kinds of phosphors, for example, a green phosphor and a red phosphor. The green phosphor is, for example, a particulate phosphor material, such as $(BaSr)_2SiO_4:Eu^{2+}$ that absorbs the blue light emitted from the LED devices 30 and wavelength-converts it into green light. The red phosphor is, for example, a particulate phosphor material, such as $CaAlSiN_3:Eu^{2+}$, that absorbs the blue light emitted from the LED devices 30 and wavelength-converts it into red light. In this case, the light-emitting apparatus 1 produces white light by combining the blue light emitted from the blue LED devices 30 with the green light and red light generated by exciting the green phosphor and red phosphor with the emitted light.

The Zener diodes 60 are mounted on the circuit substrate 20 to prevent the LED devices 30A and 30B from being destroyed due to static electricity or the like. In the light-emitting apparatus 1, actually two groups of Zener diodes 60 are provided to correspond to the interconnect patterns 23A and 23B, the connecting electrodes 24A and 24B, and the LED devices 30A and 30B. As shown in FIG. 2, the Zener diodes 60A are connected to the interconnect pattern 23A in parallel with the LED devices 30A, while the Zener diodes 60B are connected to the interconnect pattern 23B in parallel with the LED devices 30B. When a voltage is applied to the LED devices 30 in the reverse direction, the Zener diodes 60 protect the LED devices 30A and 30B by bypassing the current.

As described above, the light-emitting apparatus 1 includes the interconnect patterns 23A and 23B, the connecting electrodes 24A and 24B, the LED devices 30A and 30B, and the Zener diodes 60A and 60B, respectively in pairs. Assuming 250 W for each of the two systems, for example, the total output wattage of the light-emitting apparatus 1 is 500 W. At the present state of the art, a COB of up to about 300 W can be driven with an "off the shelf" power supply (driver), but if the connection system is divided into two systems with a total of four terminals, a COB of 500 W, for example, can be driven using two "off the shelf" power supplies.

Figure 5:
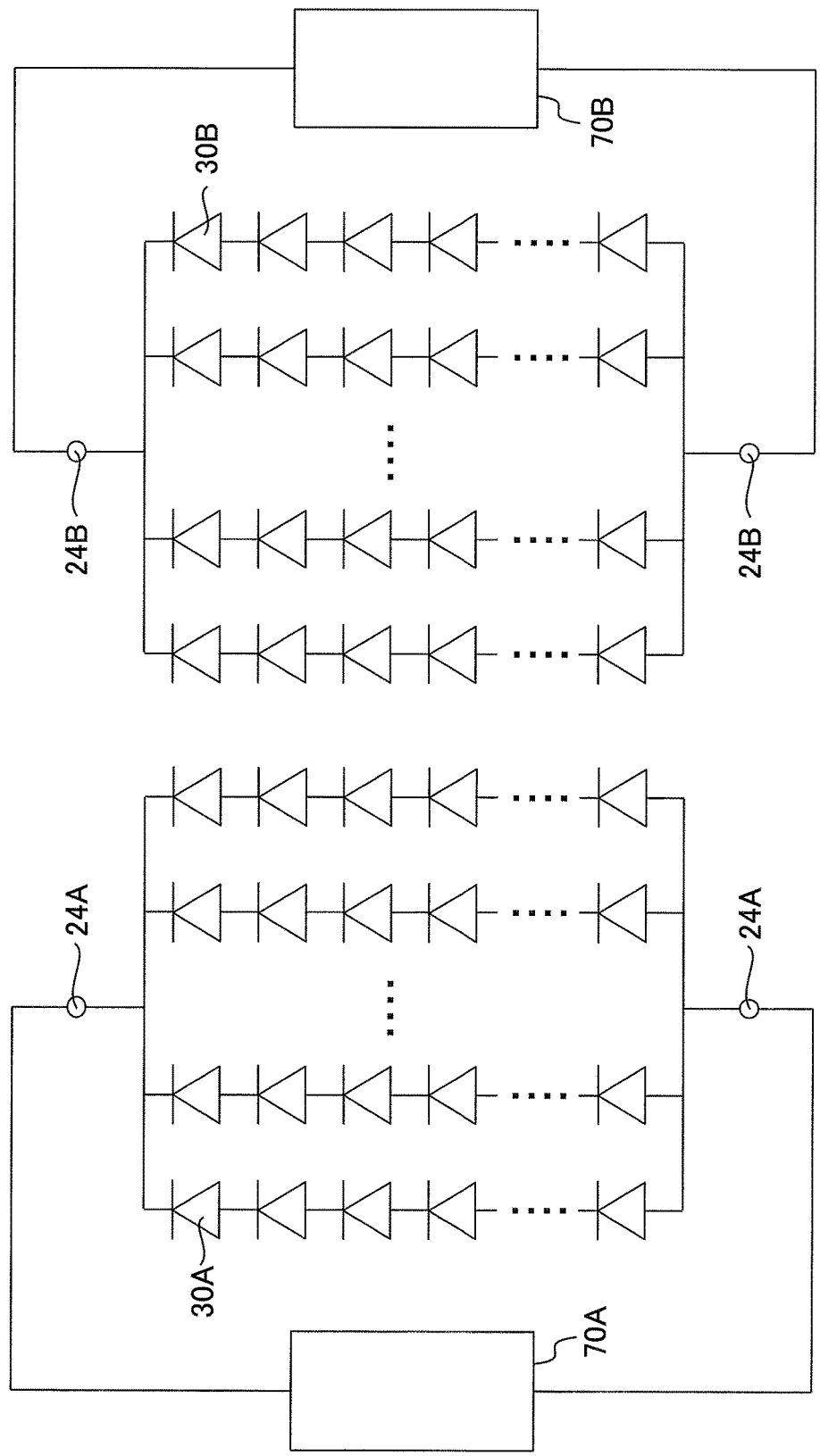
FIG. 5 is a wiring diagram showing an example of how the LED devices 30A and 30B are respectively connected.

FIG. 5 is a wiring diagram showing an example of how the LED devices 30A and 30B are respectively connected. As shown in FIG. 5, the groups of the LED devices 30A and 30B are each divided into a plurality of subgroups connected in parallel to one another, and the plurality of subgroups each contain an equal number of LED devices 30 connected in series. In the example shown in FIG. 2, the groups of the LED devices 30A and 30B are each divided into 13 subgroups connected in parallel to one another, each subgroup containing 36 devices connected in series, each group thus containing a total of 468 devices, and a total of 936 LED devices 30 are mounted to construct the light-emitting apparatus 1.

Further, as shown in FIG. 5, the connecting electrode 24A is connected to a driver 70A, and the connecting electrode 24B is connected to a driver 70B which is different from the driver 70A. The drivers 70A and 70B are examples of the first and second drivers, respectively. The total number of the LED devices 30A and 30B may be larger than the number of LED devices that can be driven by one or the other of the drivers 70A and 70B. That is, in the light-emitting apparatus 1, by dividing the connection system into two systems as described above, it becomes possible to drive a larger number of LED devices than a single "off the shelf" power supply (driver) can drive.

The substrate of the light-emitting apparatus need not be limited to the substrate formed by bonding together the mounting substrate 10 and the circuit substrate 20, but the interconnect patterns and the connecting electrodes may be formed directly on the mounting substrate on which the light-emitting devices are mounted.

Further, both of the LED devices 30A and 30B need not necessarily be configured to emit light of the same color. For example, LED devices that emit light of different colors may be used as the LED devices 30A and 30B, respectively. Alternatively, the LED devices 30A and 30B may be configured to emit light of different colors, for example, by changing either or both of the kind and mixing ratio of the phosphor contained in the sealing resin 50. Further alternatively, the light-emitting apparatus 1 may be used as a 250-W light-emitting apparatus that can emit light of a desired one of two colors by switching between the LED devices 30A and 30B.

The features characterizing the arrangement of the LED devices 30A and 30B will be described below.

Figure 6:
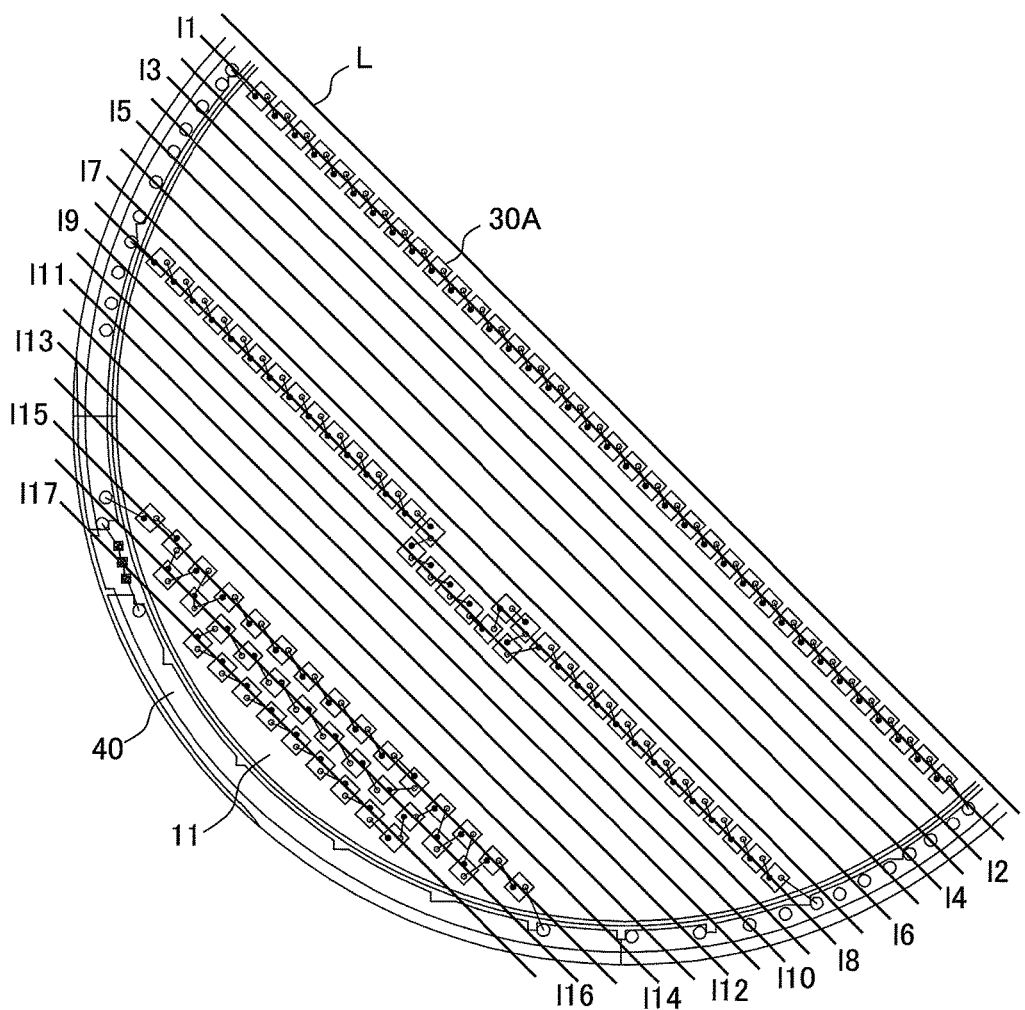
FIG. 6 is a diagram for explaining the arrangement of the LED devices 30.
Figure 7A:
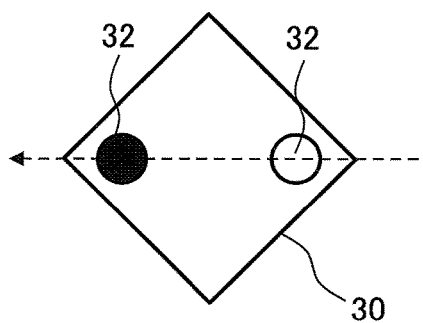
FIGS. 7A to 7D are diagrams for explaining the rotation angle of each LED device 30.
Figure 7B:
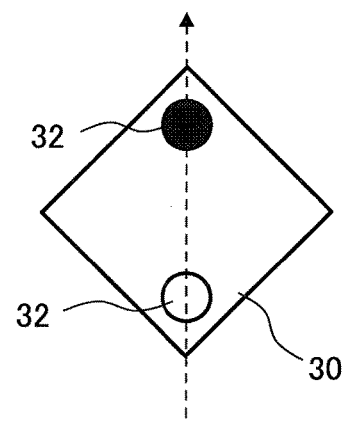
Figure 7C:
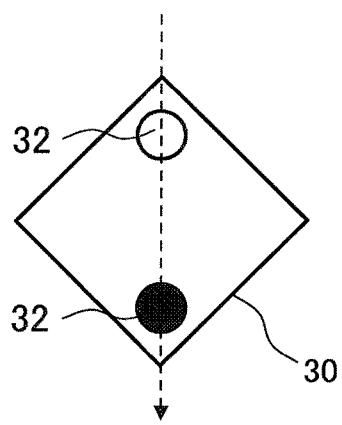
Figure 7D:
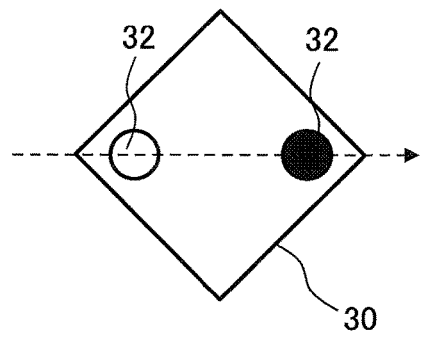

FIG. 6 is a diagram for explaining the arrangement of the LED devices 30 in each row. In FIG. 6, the arrangement of three subgroups of LED devices 30A out of the 13 subgroups is shown in enlarged form for illustrative purposes. As shown in FIG. 6, the 13 subgroups of LED devices 30A are arranged along nearly equally spaced straight lines 1 drawn in parallel to the diagonal line L and totaling to 17 in number (11 to 117). In the straight line 1 located in the vicinity of the diagonal line L, the length of the chord corresponding to the straight line portion overlapping the mounting region 11 is approximately equal to the diameter of the mounting region 11; therefore, the series-connected LED devices 30A in each subgroup located near the diagonal line L are arranged in a straight line. However, since the length of the chord corresponding to the straight line portion overlapping the mounting region 11 becomes shorter as the distance from the diagonal line L increases, the series-connected LED devices 30A in each subsequent subgroup are arranged so as to span across a plurality of adjacent straight lines 1. The LED devices 30A in the subgroup located farthest from the diagonal line L are arranged so as to span across three straight lines 115 to 117.

In this way, the LED devices 30A as a whole are arranged with substantially uniform spacing along the 17 straight lines 11 to 117. Though not shown here, the LED devices 30B are also arranged with substantially uniform spacing along a total of 17 nearly equally spaced straight lines parallel to the diagonal line L in the same manner as the LED devices 30A. When the LED devices 30 are arranged with substantially uniform spacing in this way, the heat generated from any LED device 30 is evenly dissipated, which is desirable from the standpoint of heat dissipation. The spacing between any two adjacent LED devices 30 is, for example, 0.2 mm. This device pitch is set by considering the relationship between the amount of heat generated from the LED devices 30 and the amount of heat dissipated via the mounting substrate 10.

As shown in FIG. 2, each LED device 30 is mounted at an angle relative to one side of the mounting substrate 10. Further, not all of the LED devices 30 are oriented in the same direction, but any two adjacent LED devices 30 are oriented in the same direction or at an angle of 90, 180, or 270 degrees relative to each other so that the length of the wire 31 connecting between the two LED devices 30 does not exceed a predetermined upper limit value. That is, since the diagonal line L is inclined at an angle of 45 degrees with respect to the side of the mounting substrate 10, each LED device 30 is rotated at an angle of 45, 135, 225, or 315 degrees with respect to the side of the mounting substrate 10. The upper limit value is set, for example, to a value approximately equal to the center-to-center spacing between the two adjacent LED devices 30, in other words, to a value that does not cause the wire 31 to cross another wire 31. Generally, if the wire 31 is too long, the wire 31 tends to droop due to gravity and may contact a portion other than the device electrodes; therefore, the upper limit value is set to a value that does not cause such a problem, for example, to a value smaller than 3 mm.

FIGS. 7A to 7D are diagrams for explaining the rotation angle of each LED device 30. Each LED device 30 has two device electrodes 32, the anode and the cathode. In FIGS. 7A to 7D, the two device electrodes 32 are indicated by a filled circle and an unfilled circle, respectively, and the direction joining the two device electrodes 32 is indicated by an arrow so that the rotation angle of the LED device 30 can be identified. For example, if it is assumed that the side of the mounting substrate 10 extends laterally as viewed in the figure, FIGS. 7A to 7D show the conditions in which the LED devices 30 are rotated 45, 135, 225, and 315 degrees, respectively, with respect to the side of the mounting substrate 10. When the device electrodes 32 of the two LED devices 30 that are connected together are brought closer to each other by suitably rotating the respective LED devices 30, the LED devices 30 can be connected to each other over the shortest distance by the wire 31. Accordingly, in the light-emitting apparatus 1, a larger number of LED devices 30 can be mounted for the same shape and size of the mounting region 11, than would be the case if all the LED devices 30 were oriented in the same direction and arranged parallel to the side of the mounting substrate 10.

Figure 8:
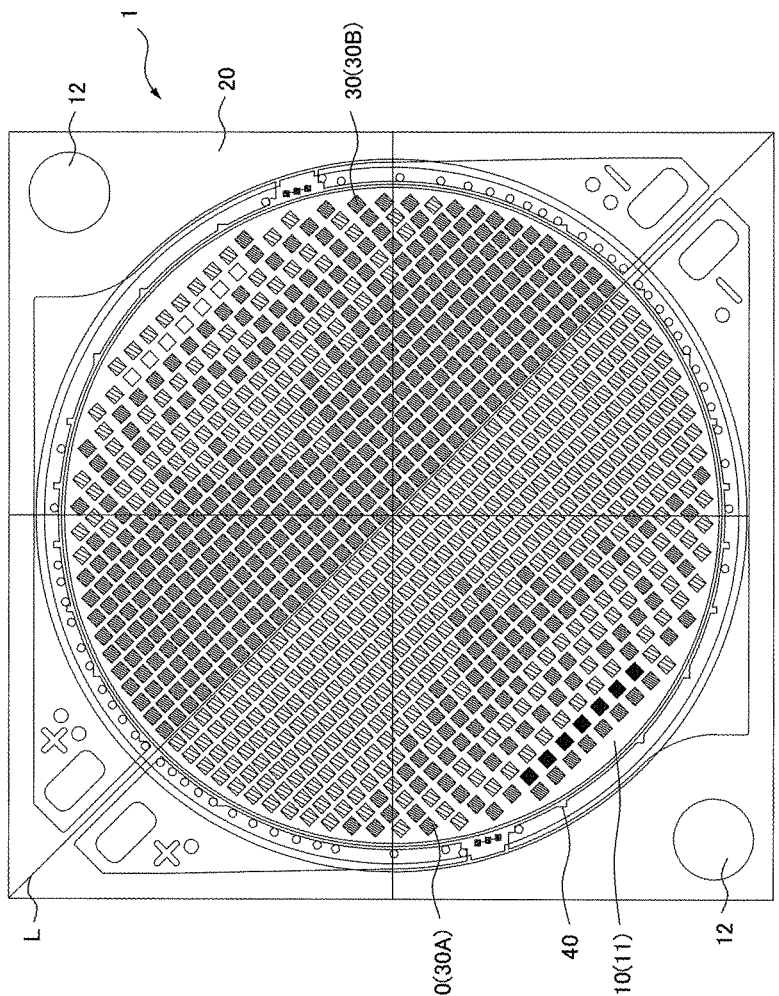
FIG. 8 is a diagram for explaining how the LED devices 30 with different rotation angles are arranged in the light-emitting apparatus 1.

FIG. 8 is a diagram for explaining how the LED devices 30 with different rotation angles are arranged in the light-emitting apparatus 1. In FIG. 8, the LED devices 30 rotated 45, 135, 225, and 315 degrees with respect to the side of the mounting substrate 10 are indicated by dark gray, black, white, and light gray rectangles, respectively.

As can be seen from FIG. 8, in the light-emitting apparatus 1, the arrangement of the LED devices 30 is symmetrical about the diagonal line L in terms of the mounting position and rotation angle. That is, when the circular mounting region 11 is bent along the diagonal line L, and one semicircular section is folded over the other semicircular section, the position of each individual LED device 30A coincides with the position of its corresponding LED device 30B, and the combination of the rotation angles of any two corresponding LED devices 30 is either a combination of 45 degrees and 315 degrees (=−45 degrees) or a combination of 135 degrees and 225 degrees (=−135 degrees).

Further, in the light-emitting apparatus 1, the arrangement of the LED devices 30, in terms of the mounting position and rotation angle, is also symmetrical about the center point of the mounting region 11. That is, when the circular mounting region 11 is cut along the diagonal line L, and one semicircular section is rotated 180 degrees and placed over the other semicircular section, the position of each individual LED device 30A coincides with the position of its corresponding LED device 30B, and the combination of the rotation angles of any two corresponding LED devices 30 is either a combination of 45 degrees and 315 degrees (=−45 degrees) or a combination of 135 degrees and 225 degrees (=−135 degrees), as in the above case.

The symmetrical arrangement of the LED devices 30 in terms of the mounting position and rotation angle offers the advantage that the light-emitting apparatus 1 produces an evenly spread light output as a whole and the emitted light looks clear and crisp, because the LED devices 30A and 30B in the two groups emit light in much the same way.

Figure 9:
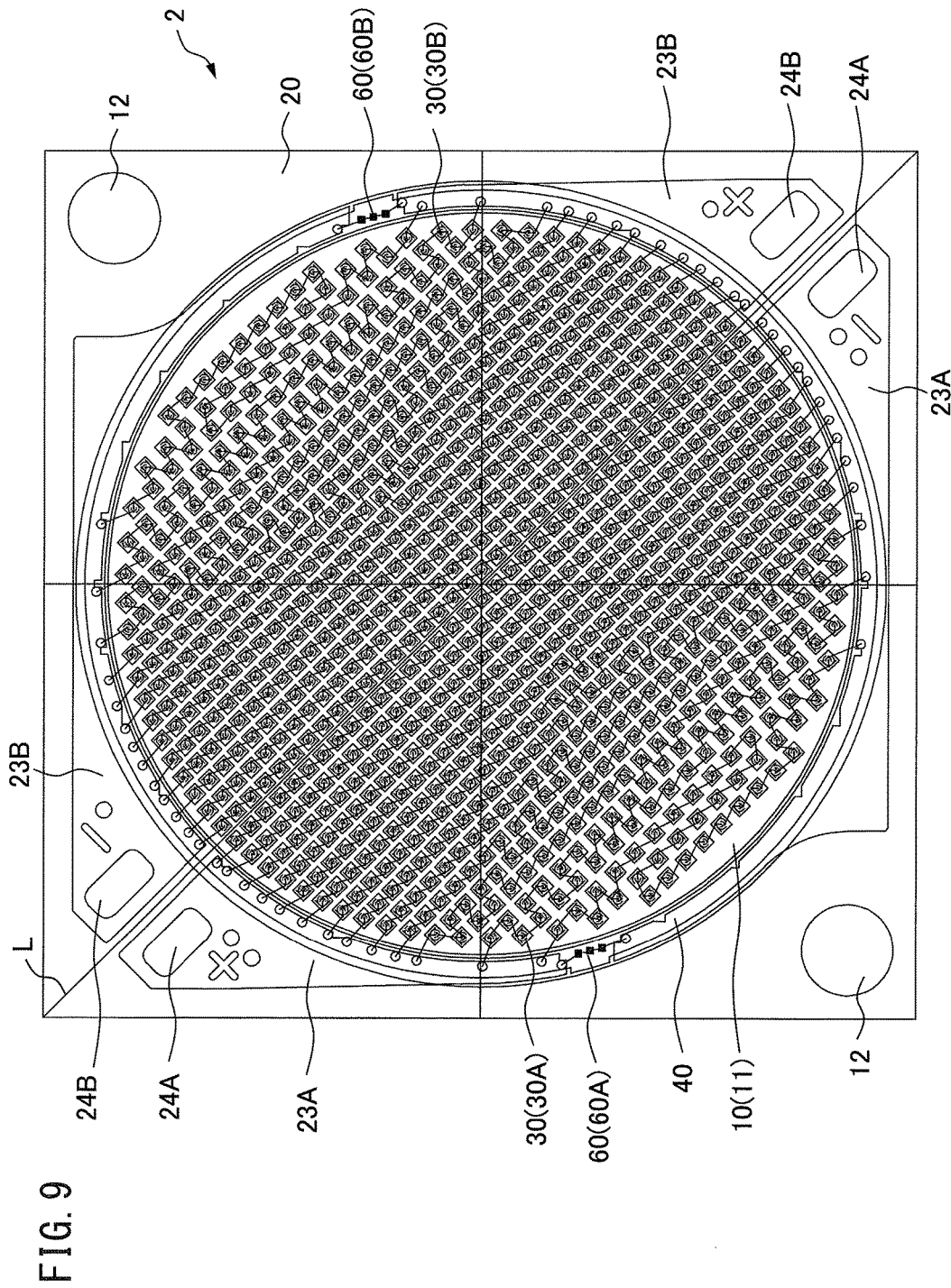
FIG. 9 is a top plan view of a light-emitting apparatus 2.

FIG. 9 is a top plan view of a light-emitting apparatus 2. The light-emitting apparatus 2 is substantially identical in configuration to the light-emitting apparatus 1, except that, in the light-emitting apparatus 2, the arrangement of the positive and negative terminals of the connecting electrode 24B is reversed from the arrangement in the light-emitting apparatus 1. In this way, the arrangement of the positive and negative terminals may be reversed between the connecting electrodes 24A and 24B. The terminal arrangement of the light-emitting apparatus 2 is advantageous, for example, when it is desired to connect the two groups of LED devices 30A and 30B, in series.

Figure 10A:
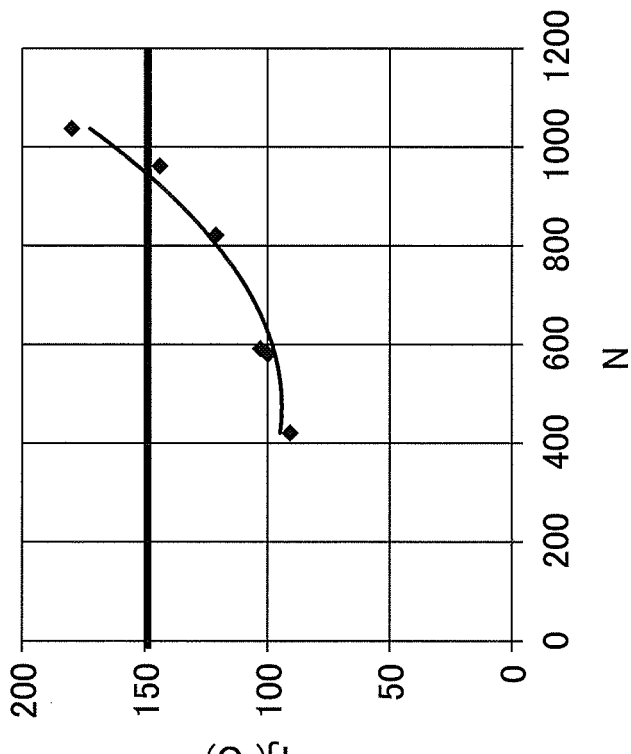
FIGS. 10A and 10B are graphs each illustrating the relationship between the packing density of LED devices 30 and the junction temperature.
Figure 10B:
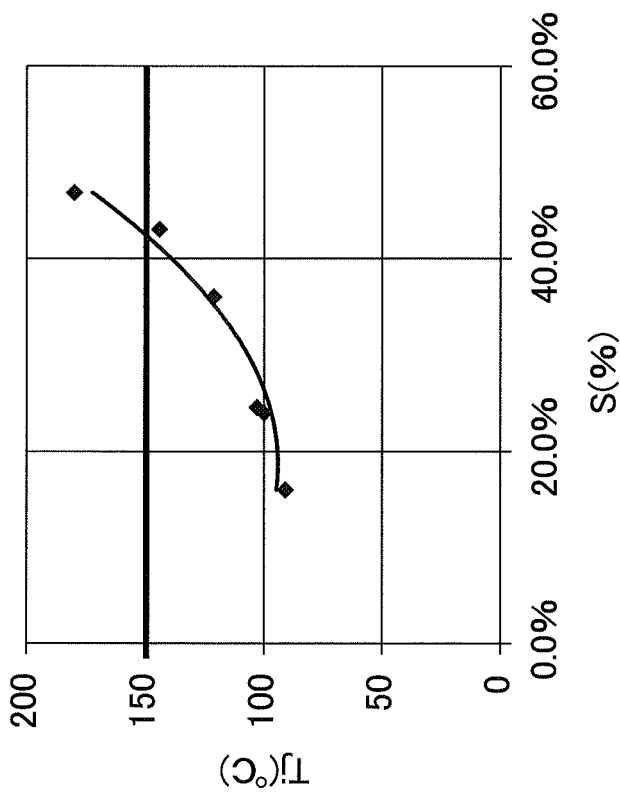

FIGS. 10A and 10B are graphs each illustrating the relationship between the packing density of LED devices 30 and the junction temperature. FIG. 10A illustrates the general relationship between the ratio of the device surface, S (%), per square millimeter of the light emitting surface and the junction temperature Tj (° C.) when absolute maximum current is applied to the LED device. FIG. 10B illustrates the relationship between the junction temperature Tj (° C.) and the number N of LED devices 30 mounted in a light-emitting apparatus identical in configuration to the light-emitting apparatuses 1 and 2.

The graphs of FIGS. 10A and 10B indicate that the junction temperature Tj increases as the packing density of LED devices increases. Since the junction temperature Tj for the LED device 30 is 150° C. at maximum, it can be seen from the graph of FIG. 10B that the upper limit on the number of LED devices 30 mounted in the light-emitting apparatus 1 or 2 is about 1,000. That is, for the number of LED devices that can be mounted on the mounting region 11, there is a certain upper limit which is determined by the relationship between the amount of heat generated from the LED devices 30 and the phosphor particles contained in the sealing resin 50 and the amount of heat dissipated via the mounting substrate 10, and the number of LED devices mounted in the light-emitting apparatus 1 or 2 is smaller than this upper limit.

On the other hand, the lower limit on the number of LED devices 30 mounted in the light-emitting apparatus 1 or 2 is determined by the length of the wire 31. Since a problem occurs due to wire drooping if the wire 31 is too long, as earlier described, the upper limit for the length of each individual wire 31 is set, for example, to a value smaller than 3 mm. Accordingly, the lower limit on the number of LED devices 30 mounted is obtained by dividing the diameter of the mounting region 11 by the maximum wire length of 3 mm. For example, in the light-emitting apparatuses 1 and 2, since the diameter of the mounting region 11 is about 30 mm, at least ten LED devices 30A and an equal number of LED devices 30B must be mounted.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting apparatus comprising:
    a substrate;
    first and second pairs of terminals, each pair including two terminals disposed at two opposed positions on the substrate;
    a first plurality of light-emitting devices which are mounted in one of two sections formed by bisecting a mounting region on the substrate by a line segment jointing the two positions, and which are connected to the first pair of terminals; and
    a second plurality of light-emitting devices which are mounted in the other section of the mounting region, and which are connected to the second pair of terminals, and wherein
    the first and second plurality of light-emitting devices are arranged in a direction parallel to the line segment, and are each mounted at an angle relative to one side of the substrate.

2. The light-emitting apparatus according to claim 1, wherein
    the two positions are two opposite corners of the substrate,
    the line segment is a diagonal line joining the two corners,
    the first plurality of light-emitting devices and the second plurality of light-emitting devices are respectively divided into a plurality of subgroups connected in parallel to one another,
    the plurality of subgroups each contain an equal number of light-emitting devices connected in series, and
    the first and second plurality of light-emitting devices together form a plurality of rows arranged with uniform spacing along the diagonal line.

3. The light-emitting apparatus according to claim 2, wherein the light-emitting devices contained in each of the plurality of subgroups are connected in series by wires, and any two adjacent ones of the light-emitting devices are oriented in the same direction or at an angle of 90, 180, or 270 degrees relative to each other so that the length of the wire connecting between the two light-emitting devices does not exceed a predetermined upper limit value.

4. The light-emitting apparatus according to claim 3, wherein the arrangement of the first and second plurality of light-emitting devices is symmetrical about the diagonal line in terms of mounting position and rotation angle.

5. The light-emitting apparatus according to claim 3, wherein the arrangement of the first and second plurality of light-emitting devices is symmetrical about a center point of the mounting region in terms of mounting position and rotation angle.

6. The light-emitting apparatus according to claim 1, wherein
    the first pair of terminals is connected to a first driver,
    the second pair of terminals is connected to a second driver which is different from the first driver, and
    the total number of the first and second plurality of light-emitting devices is larger than the number of light-emitting devices that can be driven by the first driver or the second driver.

* * * * *